(12) United States Patent
Page

(10) Patent No.: US 6,593,240 B1
(45) Date of Patent: Jul. 15, 2003

(54) TWO STEP CHEMICAL MECHANICAL POLISHING PROCESS

(75) Inventor: Joseph E. Page, Mechanicsville, VA (US)

(73) Assignee: Infineon Technologies, North America Corp, San Jose, CA (US)

( * ) Notice: Subject to any disclaimer, the term of this patent is extended or adjusted under 35 U.S.C. 154(b) by 10 days.

(21) Appl. No.: 09/723,802

(22) Filed: Nov. 28, 2000

Related U.S. Application Data
(60) Provisional application No. 60/214,409, filed on Jun. 28, 2000.

(51) Int. Cl.$^7$ .................. H01L 21/302; C23F 1/00; B24B 1/00; B24B 7/19; B24B 7/30; B24B 29/00; B24B 5/00
(52) U.S. Cl. .............. 438/692; 438/424; 156/345; 216/88; 216/89; 451/41; 451/285
(58) Field of Search .................. 438/692, 693, 438/424; 156/345; 216/88, 89; 451/41, 285

(56) References Cited

U.S. PATENT DOCUMENTS

| | | | | |
|---|---|---|---|---|
| 5,298,110 A | * | 3/1994 | Schoenborn et al. | |
| 5,817,567 A | * | 10/1998 | Jang et al. | 438/427 |
| 5,872,043 A | * | 2/1999 | Chen | |
| 5,876,490 A | * | 3/1999 | Ronay | 106/3 |
| 5,899,745 A | * | 5/1999 | Kim et al. | 438/692 |
| 5,951,373 A | * | 9/1999 | Shendon et al. | 451/41 |
| 5,965,459 A | * | 10/1999 | Beyer | 438/692 |
| 5,975,991 A | * | 11/1999 | Karlsrud | 451/41 |
| 6,001,740 A | | 12/1999 | Varian et al. | |
| 6,069,081 A | | 5/2000 | Kelleher et al. | |
| 6,227,949 B1 | * | 5/2001 | Yi et al. | 451/57 |
| 6,315,645 B1 | * | 11/2001 | Zhang et al. | 451/65 |
| 6,435,942 B1 | * | 8/2002 | Jin et al. | 451/8 |

* cited by examiner

*Primary Examiner*—John F. Niebling
*Assistant Examiner*—Ron Pompey

(57) ABSTRACT

A method for polishing a semiconductor wafer includes providing a semiconductor wafer having topographical features and forming a dielectric layer on the semiconductor wafer to fill portions between the features. The dielectric layer is planarized across the entire semiconductor wafer for a first portion of a polishing process. The dielectric layer is polished for bulk removal of the dielectric layer for a remaining portion of the polishing process.

24 Claims, 12 Drawing Sheets

TWO STEP CHEMICAL MECHANICAL POLISHING PROCESS

CROSS REFERENCE TO RELATED APPLICATION

This application claims priority to Provisional Application Serial No. 60/214,409 filed Jun. 28, 2000. Provisional Application Serial No. 60/214,409 is incorporated herein by reference.

BACKGROUND

1. Technical Field

This disclosure relates to semiconductor fabrication and more particularly, to a method for planarization of semiconductor wafers in a two step polish process.

2. Description of the Related Art

Semiconductor devices are fabricated by processing layers of materials deposited on a surface of a substrate. One such process includes planarizing a top surface to remove, flatten or smooth the top surface. Planarization techniques are not always uniform across a top surface of a wafer, however, and often depend on the type and density of devices already formed below the layer to be planarized. A final step in the fabrication of isolation regions for semiconductor devices typically includes a chemical-mechanical polishing (CMP) process. The CMP process is employed to planarize and/or remove dielectric material, such as oxide for the isolations regions from a top surface of the wafer.

Referring to FIG. 1, during CMP, a wafer 10 is held in a carrier 12, device side facing down. The device side is applied to a pad 14, which is affixed to a table 16. The table 16 and carrier 12 spin, force is applied through the carrier 12, and slurry or chemical 18 is dispensed in the pad 14.

Conventionally, oxide CMP employs a very hard urethane pad stacked on a soft felt pad. As shown in FIG. 2, a hard pad 20 is stacked on a soft pad 22. The composite of the two pads tends to deform, reducing planarization effectiveness, as illustrated in FIG. 2. The result of the pad deformation is reduced planarization. To compensate for the reduced planarization, a mask and etch step is performed. In addition, typically, after planarization is achieved, additional polishing is necessary to achieve a remaining oxide target thickness (i.e., reduce the oxide thickness). To provide proper planarization and target thicknesses, a very uniform, well-controlled process is required.

To attempt to make the planarization process more uniform, preprocessing steps may be employed. In one case, a mask process and an etching process are employed to remove material in selected areas to provide a more uniform layer to be planarized. For example, one method for forming isolation regions includes a deposition of an oxide for a void free fill, a masking and etch step to assist planarization by reducing the oxide over large features and a film removal and planarization by means of a chemical mechanical polish.

One problem with a mask and etch process is that the mask process is typically very expensive. An etch mask must be developed which includes regions which need to be etched and regions which are not be etched. The masking steps, lithographic steps and the etching steps require process time and materials. This makes the preprocessing needed to assist planarization less attractive, especially in sub 0.25 micron technology. However, the elimination of the masking step is generally considered not possible when employing high density plasma deposited films with current chemical-mechanical polishing (CMP) consumables because improved planarization is at the expense of global uniformity.

Therefore, a need exists for a method of depositing and planarizing a dielectric layer with improved global uniformity without the need for preprocessing, such as, for example, masking and etching the dielectric layer before planarization. A further need exists for increased throughput for polishing processes.

SUMMARY OF THE INVENTION

A method for polishing a semiconductor wafer, in accordance with the present invention, includes providing a semiconductor wafer having topographical features and forming a dielectric layer on the semiconductor wafer to fill portions between the features. The dielectric layer is planarized across the entire semiconductor wafer for a first portion of a polishing process. The dielectric layer is polished for bulk removal of the dielectric layer for a remaining portion of the polishing process.

Another method for polishing a semiconductor wafer, includes the steps of providing a semiconductor wafer having topographical features, forming a dielectric layer on the semiconductor wafer to fill portions between the features, providing a first polishing substance on a planarization polishing pad, planarizing the dielectric layer with the first polishing substance and the planarization polishing pad for a first portion of a polishing process, providing a second polishing substance on a bulk removal polishing pad, and polishing the dielectric layer with the second polishing substance and the bulk removal polishing pad for bulk removal of the dielectric layer for a remaining portion of the polishing process.

Yet another method for polishing a semiconductor wafer, includes the steps of providing a semiconductor wafer having topographical features, forming a dielectric layer on the semiconductor wafer to fill portions between the features, providing a first platen of a polishing tool with a first slurry on a single non-stacked polishing pad, planarizing the dielectric layer with the first slurry and the single non-stacked polishing pad for a first portion of a polishing process, providing a second platen on the polishing tool with a second slurry on a stacked polishing pad, transferring the wafer to the second platen, and polishing the dielectric layer with the second slurry and the stacked polishing pad for bulk removal of the dielectric layer for a remaining portion of the polishing process.

In other methods, the step of planarizing may include employing a single non-stacked polishing pad, which may include, for example, urethane or a fixed abrasive pad. The step of polishing the dielectric layer may include employing a stacked polishing pad. The stacked polishing pad may include a first pad for contacting the wafer and a second pad for supporting the first pad. The second pad may be softer than the first pad to improve polishing uniformity, surface finishing, and defectivity. The step of polishing the dielectric layer may include employing a single felt pad. The step of polishing may include the step of polishing with precipitated silica particle slurry. The step of planarizing may include the step of polishing with fumed silica slurry. The step of planarizing may include the step of polishing with a fixed abrasive pad and a chemical for activating the polishing of the fixed abrasive pad. The steps of planarizing and polishing may be performed on different platens of a same tool. The first portion is preferably about 50% of a total polishing time for the polishing process.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention eliminates the necessity to employ an expensive mask and etch step to assist the planarization, process employed in the fabrication of semiconductor devices. The present invention will be illustratively described by way of example, for chemical mechanical polishing (CMP) of isolation regions for active areas of semiconductor devices, for example shallow trench isolation (STI) regions. The present invention is applicable to any CMP process and the illustrative examples as described herein should not be construed as limiting the present invention.

In accordance with one aspect of the present invention, a method to achieve fabrication of a shallow trench isolation without mask and etch steps is provided. In one embodiment, the present invention separates the STI CMP process into two distinct processes, using two distinct consumable sets. The first step of the process employs consumables optimized for planarization. The second step of the process employs consumables optimized for bulk removal. These process steps may be performed on a tool with two or more polish tables, with one table dedicated to the planarization step and a second table dedicated to the bulk removal step, or, on two different polish tools, one set up to optimize the planarization step, and one to optimize bulk removal. These steps may also be performed on a same tool after a change in consumables is performed.

Isolating active regions in sub 0.25 micron technology requires costly revere masking and etch steps to reduce the oxide over large features, and/or to provide a more even pattern factor, which is necessary to assist in the Chemical Mechanical Polishing (CMP). Advantageously, by separating the CMP process into two distinct processes, first being a planarization step, second being a bulk removal step, planarization can be improved to the point where the mask and etch step can be eliminated.

Figure 1:
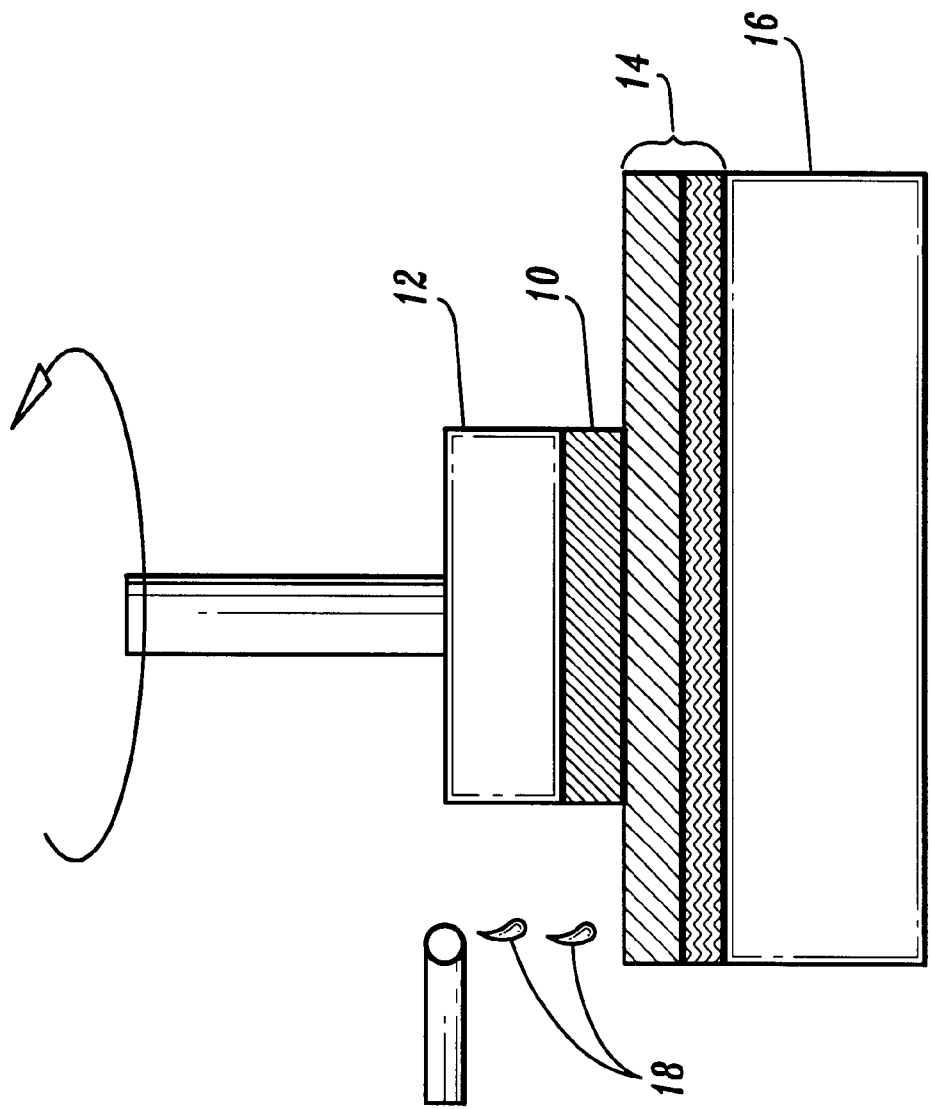
FIG. 1 is a schematic diagram showing a set up for chemical mechanical polishing in accordance with the prior art.
Figure 2:
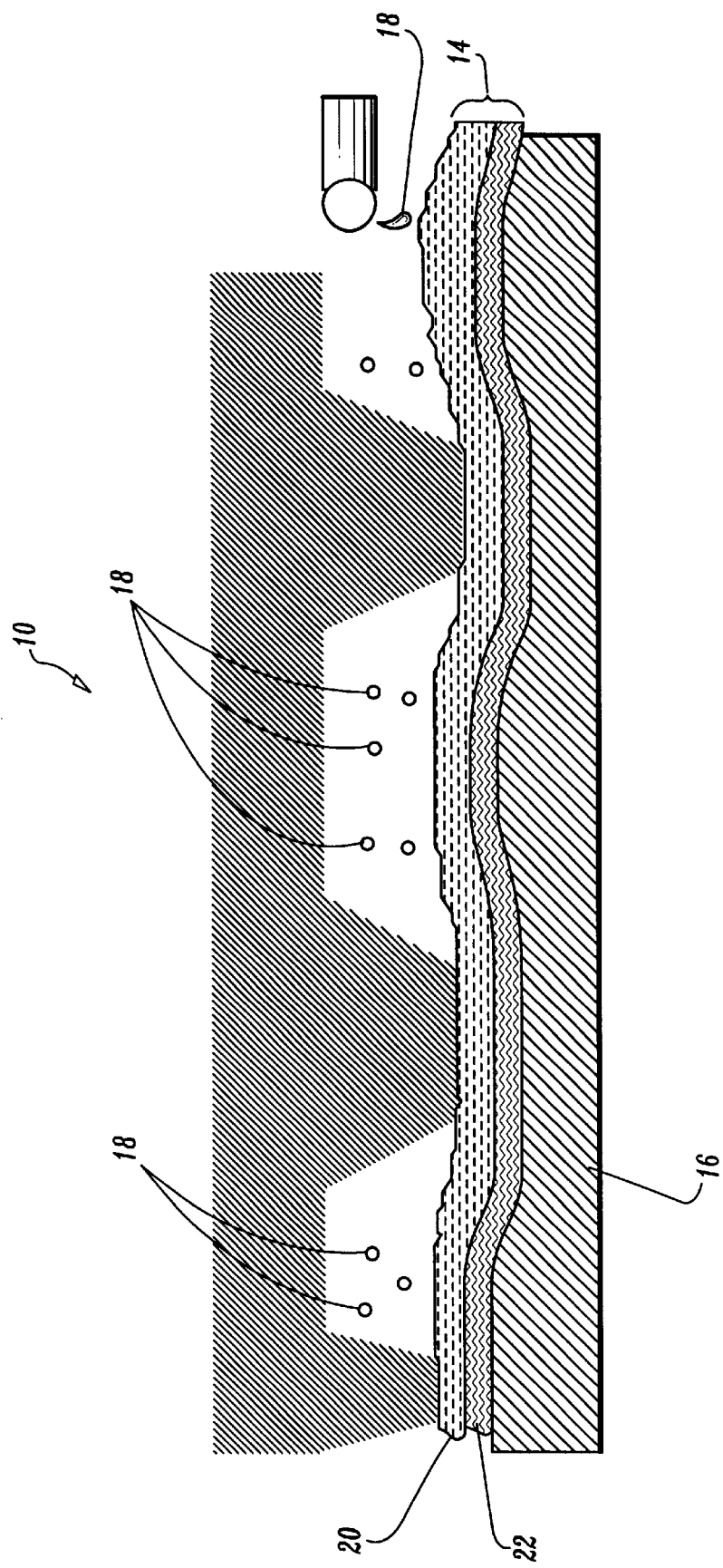
FIG. 2 is a cross-sectional view shows deformations which cause non-uniformities during in accordance with the prior art.
Figure 3:
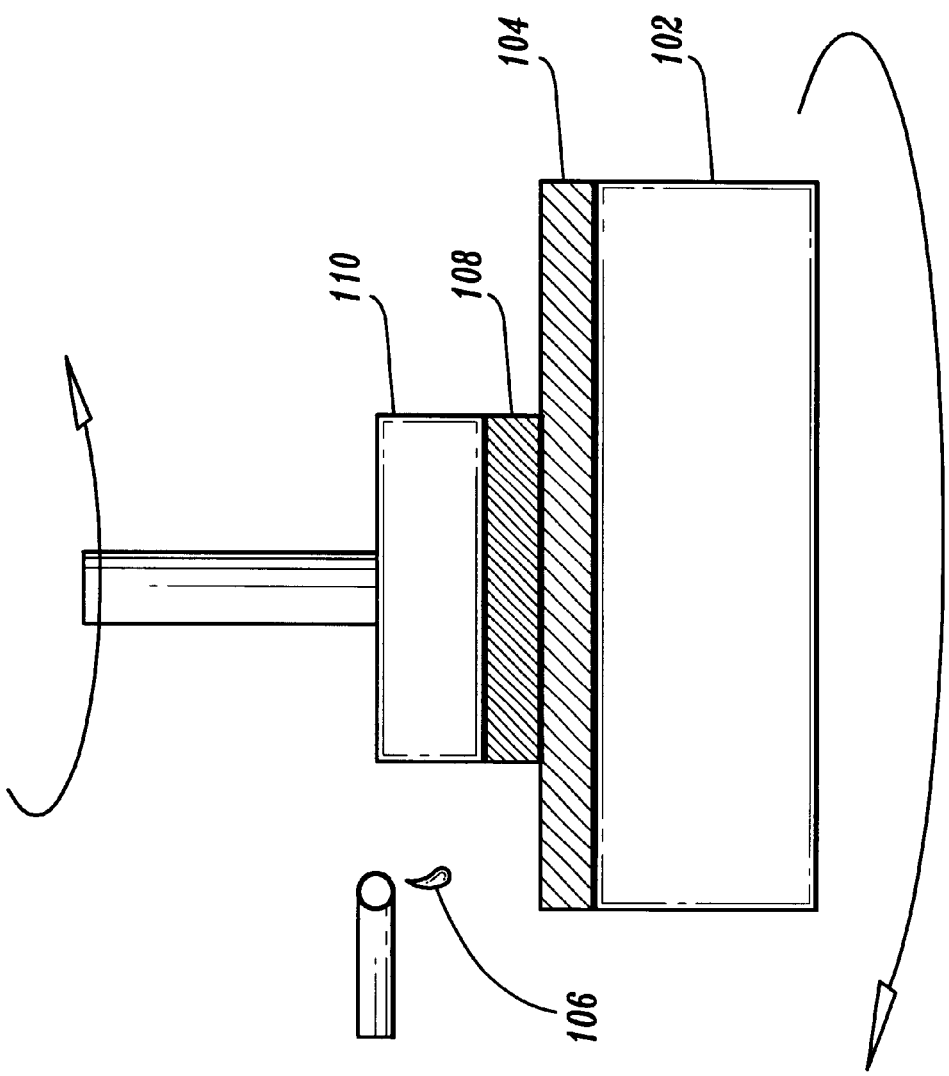
FIG. 3 is a schematic diagram showing a set up for a planarization step for chemical mechanical polishing in accordance with the present invention.

Referring now in specific detail to the drawings in which like reference numerals identify similar or identical elements throughout the several views, and initially to FIG. 3, a first step of a CMP process in accordance with the present invention is schematically depicted. A polish table 102 provides a planar surface on which a pad 104 is supported. Pad 104 may include, for example, a single (non-stacked) hard pad, a fixed abrasive pad, available commercially from 3M, Inc. or other pad designed for planarization. In a preferred embodiment, a urethane hard pad is employed for pad 104. Pad 104 may be affixed directly to a polishing table 102 or may be stacked on a separate pad. A polishing substance (slurry or chemical) 106 is introduced on pad 104 to polish a wafer 108. Slurry or chemical 106 may include, for example, precipitated silica products, fumed silica products, ceria products, potassium hydroxide or other suitable chemicals. Generally, improvement in planarization can be achieved by employing fumed silica rather than precipitated silica, and further improvement in planarization may be achieved with ceria slurries. However, cerium slurries tend to be expensive and can cause defects. Fumed silica slurries are preferred for planarization. Potassium hydroxide or other chemicals may be employed with fixed abrasive pads. Fixed abrasive pads achieve excellent planarization because the wafer's topography releases the abrasive at only the high points on the wafer. Additionally, compounds can be added to the slurry to improve planarization by protecting lower areas from polishing. Selecting the right combination of pad and slurry to optimize planarization is preferred over the selection of a particular slurry to perform planarization. Optimization of the planarization process is preferably weighed against considerations such as, for example, cost, uniformity desired, etc.

Figure 4:
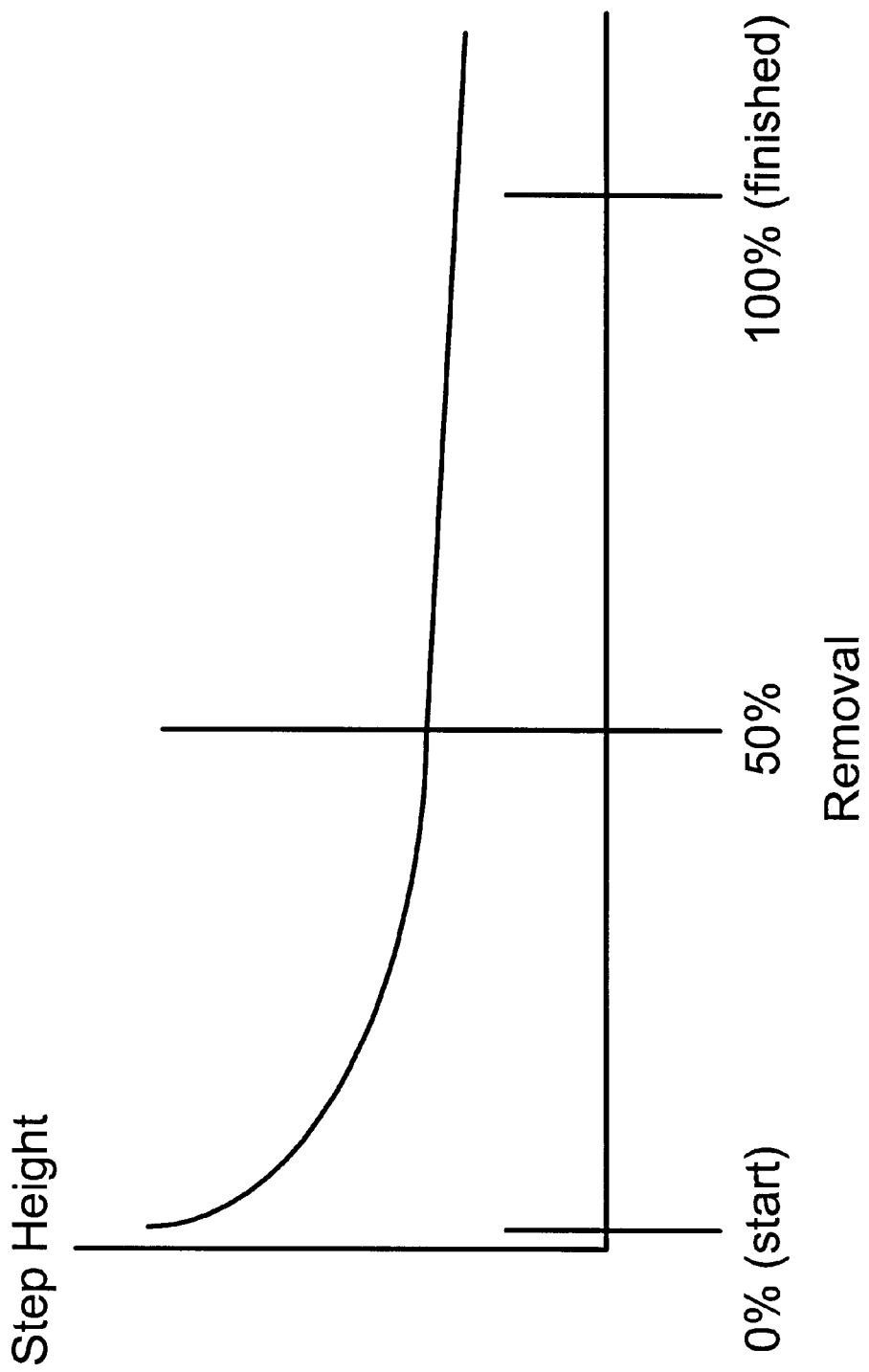
FIG. 4 is a plot of step height versus removal percent for a polish process duration.

Wafer 108 is supported by a carrier 110. Carrier 110 may be any carrier known in the art. Relative motion between pad 104 and wafer 108 is achieved by rotating carrier 110, table 102 or both. Carrier 110 and or table are rotated to provide the polishing action between slurry 106 on pad 104 and wafer 108. Polishing is accomplished by applying pressure to wafer 108 on the back of wafer 108. Advantageously, by employing a planarization pad 104, for example, a non-stacked hard pad, a higher planarity is achieved early on in the polishing process. An example, of a planarization pad includes a single non-stacked urethane pad, such as an IC1000 pad, available commercially from Rodel, Inc. The inventor has found that most planarization occurs in about the first 50% of the polish process (based on total polishing time), as illustratively shown in FIG. 4. Single, hard pads are not used conventionally because of uniformity concerns. In accordance with the present invention, the initial polishing is performed to achieve planarity. In one embodiment, the first 50% of the polish time employs a hard pad for polishing as described above. However, other amounts or proportions of time needed to achieve planarity may be employed.

For illustrative purposes, a hard pad is a pad with a compressibility of about 5% or less while a soft pad is a pad with a compressibility of about 12% or greater. Other criteria may be employed for determining the types of pads used in accordance with the invention, such as for example, hardness measurements.

Figure 5:
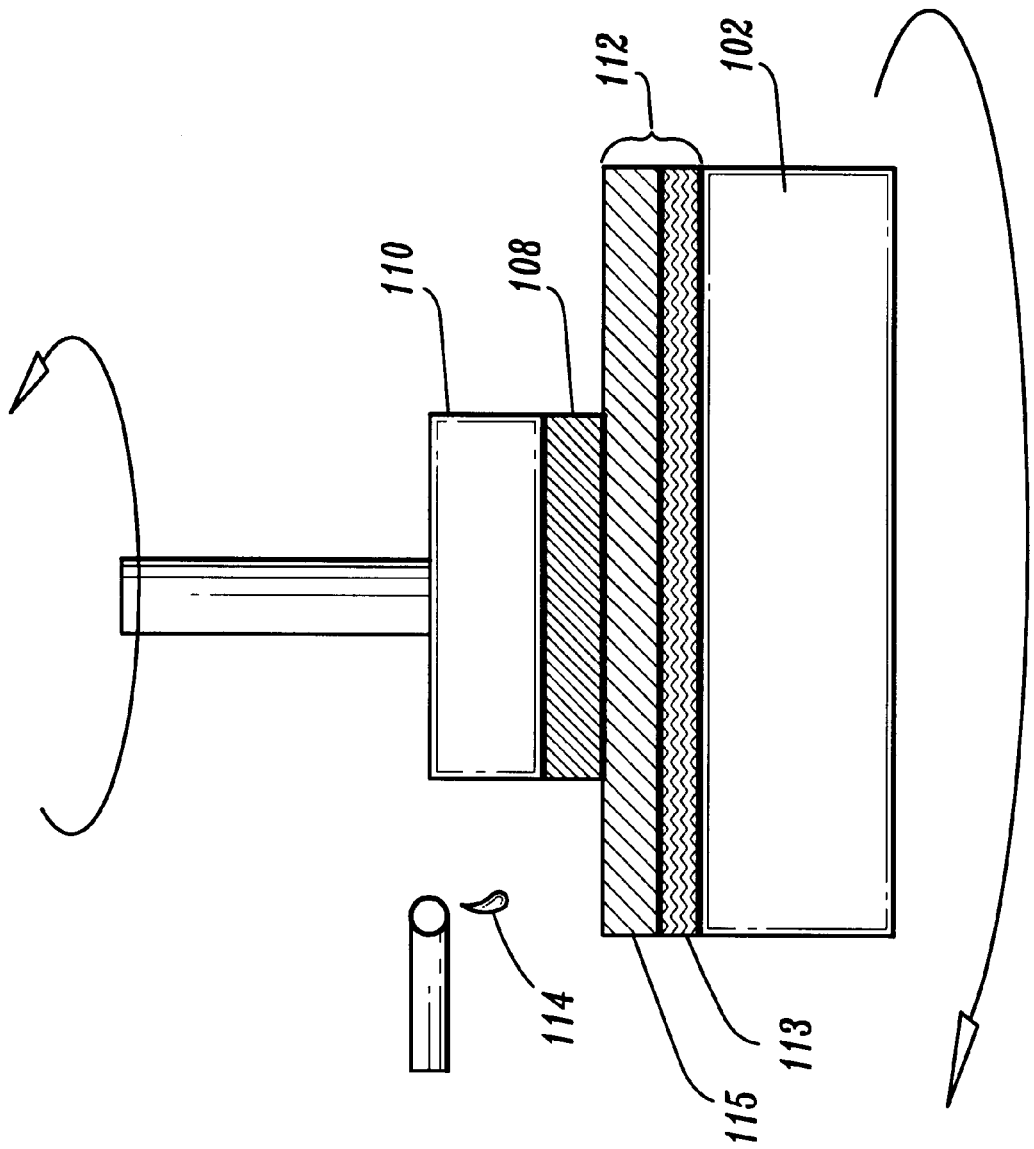
FIG. 5 is a schematic diagram showing a set up for a bulk removal step for chemical mechanical polishing in accordance with the present invention.

Referring to FIG. 5, a second step of a CMP process in accordance with the present invention is schematically depicted. The second step is employed to finish the polish by employing a more uniform pad or a bulk removal pad 112. Pad 112 may include a stacked pad or a single soft pad. Pad 112 may be employed on a same polishing table 102, or carrier 110 and wafer 108 may be transferred to another tool or to a different platen or table on the same tool. Pad 112 preferably includes a soft pad 113 and a hard pad 115. In one embodiment, hard pad 115 may be the same or similar pad as pad 104, as described with reference to FIG. 3, and soft pad 113 may include a felt pad or other compressible material. Soft pad 113 is disposed between table 102 and hard pad 115. Hard pad 115 receives slurry 114 for polishing wafer 108. Pad 112 and slurry 114 are employed for bulk removal of material (e.g., oxide) from a surface of wafer 108. Hard pad 115 may include an IC1000 pad, available commercially from Rodel, Inc., while soft pad 113 may include a Suba IV, also available commercially from Rodel, Inc. Other pads with similar characteristics as described above may also be employed. In other embodiments, a single pad may be employed for bulk removal, for example, any one of the following may be employed: a single felt pad, a single fixed abrasive pad, an embossed politex pad, available commercially from Rodel, Inc., or a Suba IV pad. Slurry 114 may preferably include a precipitated silica slurry.

Pressure is applied to wafer 108, and carrier 110, table 102 or both are rotated to provide the mechanical polishing of wafer 108. Since wafer 108 was planarized previously, bulk removal of remaining height of, for example, oxide or other material proceeds until the target height is achieved. In one embodiment, bulk removal consumes about 50% of polish time. This may adjusted depending on the circumstances.

The present invention advantageously separates the planarization polishing from bulk material removal. Preferably, a single hard pad is employed on a platen (or table) surface, followed by processing on a stacked pad on a second platen (or table) surface. This can be performed on the same tool if it has more than one platen, or two different tools.

Figure 6:
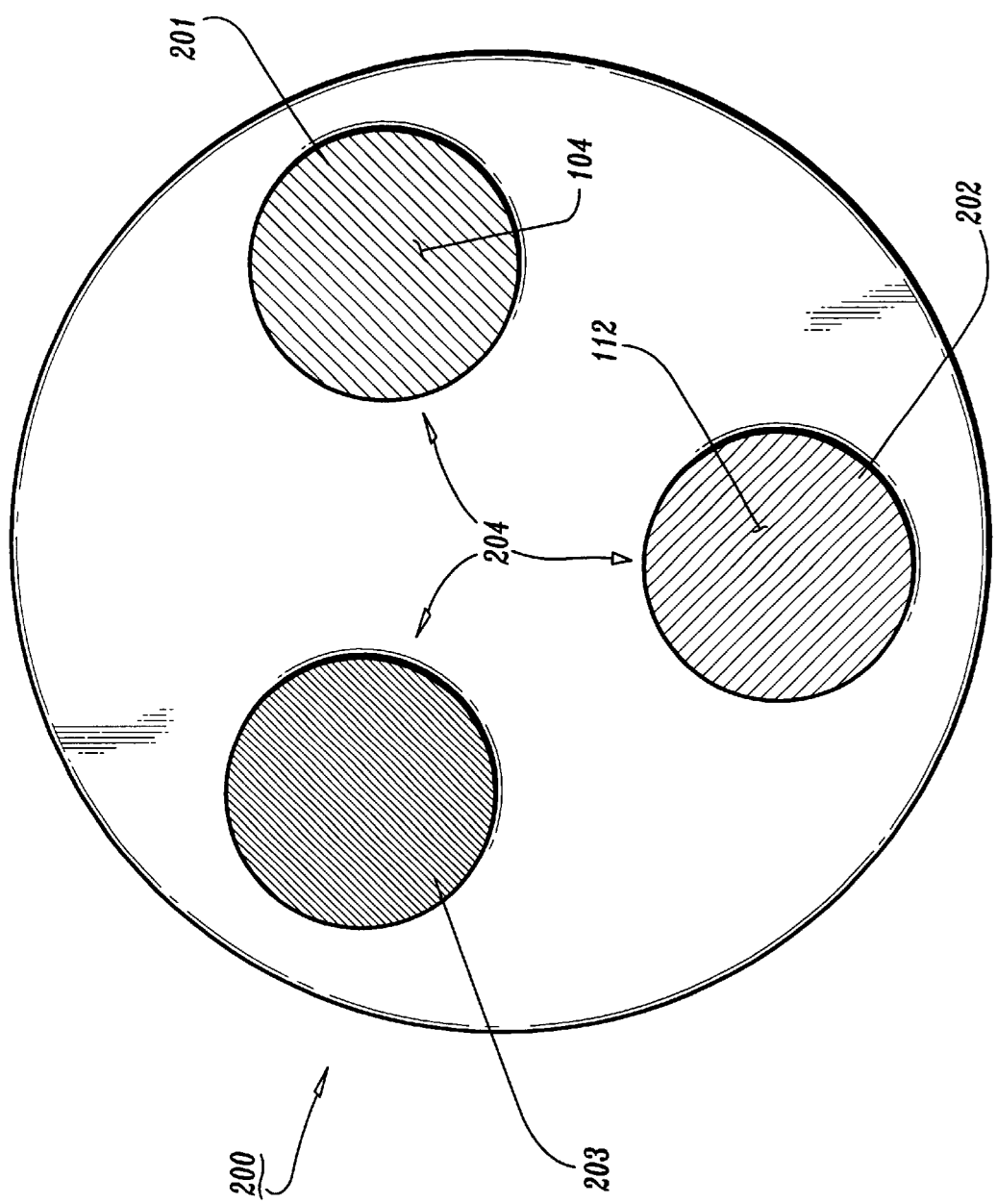
FIG. 6 is a top view of a multiple platen/table for chemical mechanical polishing in accordance with the present invention.

Referring to FIG. 6, a top view of a multiple platen tool 200 is shown to demonstrate one implementation of the present invention. Tool 200 includes a plurality of platens or tables 204. In accordance with one implementation, a first platen 201 supports a hard pad 104, such as a urethane pad. First platen 201 is designated for performing the first polish step, which planarizes the wafer surface, as described above with reference to FIG. 3. After performing the first step polishing, wafer 108 (see FIGS. 3 and 5) is transferred to a second platen 202 by carrier 110 (see FIGS. 3 and 5). Second platen 202 includes a stacked pad 112, which includes a hard pad on top of a soft pad. Bulk removal is carried out on second platen 202, as described above with reference to FIG. 5.

In alternate embodiments, after performing the second step polishing, wafer 108 (see FIGS. 3 and 5) may again be transferred to a third platen 203 by carrier 110 (see FIGS. 3 and 5). Further processing may be carried out on third (or fourth, etc.) platen 203. In one example, platen 203 is employed for carrying out a water buff to reduce defectivity of the wafer 108.

The concept of separating the planarization step from the bulk removal could apply to consumables other than the pad stack(s) described above. For example, planarization may be achieved through a fixed abrasive pad on platen 201 followed by polishing on a standard stacked pad on platen 202, or planarization may be achieved by polishing with cerium oxide slurry on platen 201 followed by polishing with a stacked pad on platen 202. It is further noted that separate tools may provide the multiple platens as described above (the platens need not be on a same tool).

Figure 7:
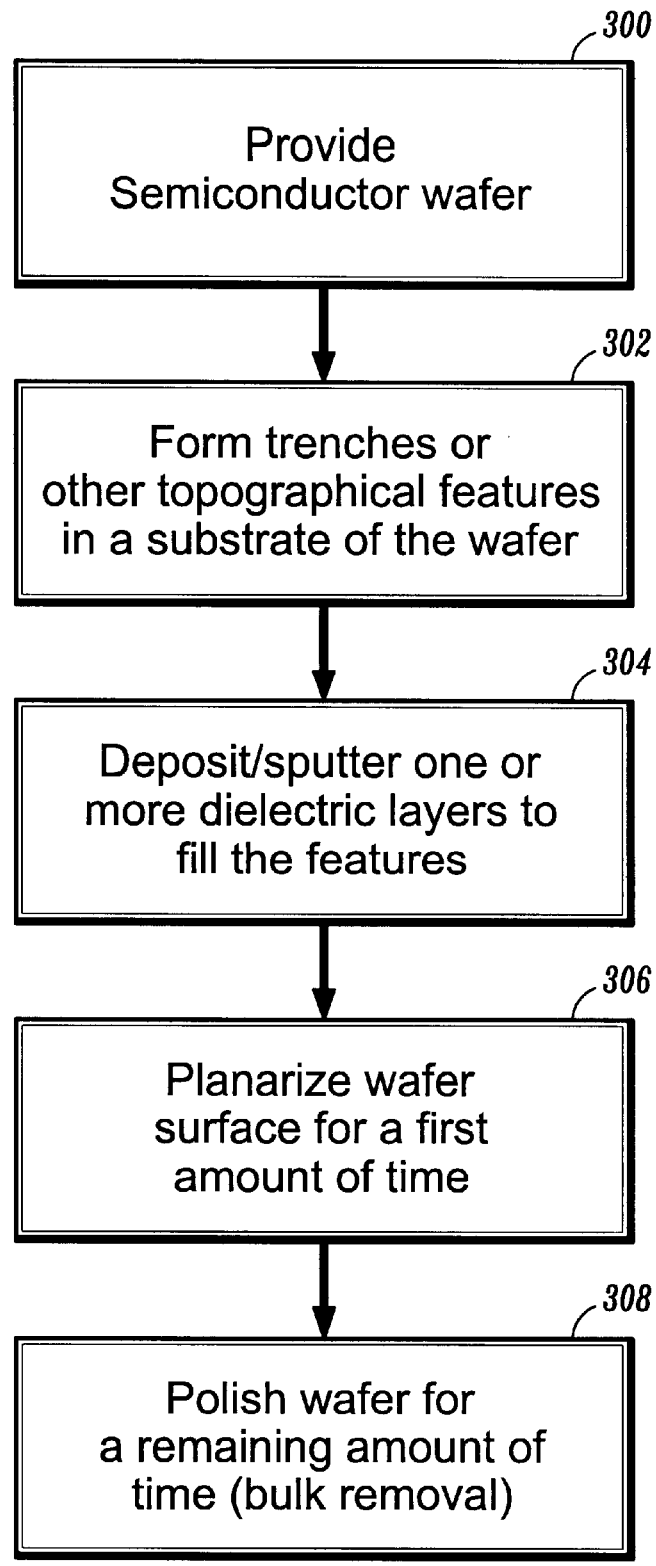
FIG. 7 is a flow diagram showing a chemical mechanical polishing method in accordance with the present invention.

Referring to FIG. 7, a flow diagram for a method of planarizing and removing a dielectric layer in accordance with the present invention is shown. In block 300, a semiconductor wafer is provided. A semiconductor wafer 108, as shown in FIGS. 3 and 5, may include, for example, semiconductor memory devices, such as dynamic or static random access memories, application specific integrated circuits (ASICs), logic chips or any other semiconductor chip. Wafer 108 is preferably formed substantially from a monocrystalline silicon, although other wafer materials may be employed.

Figure 8:
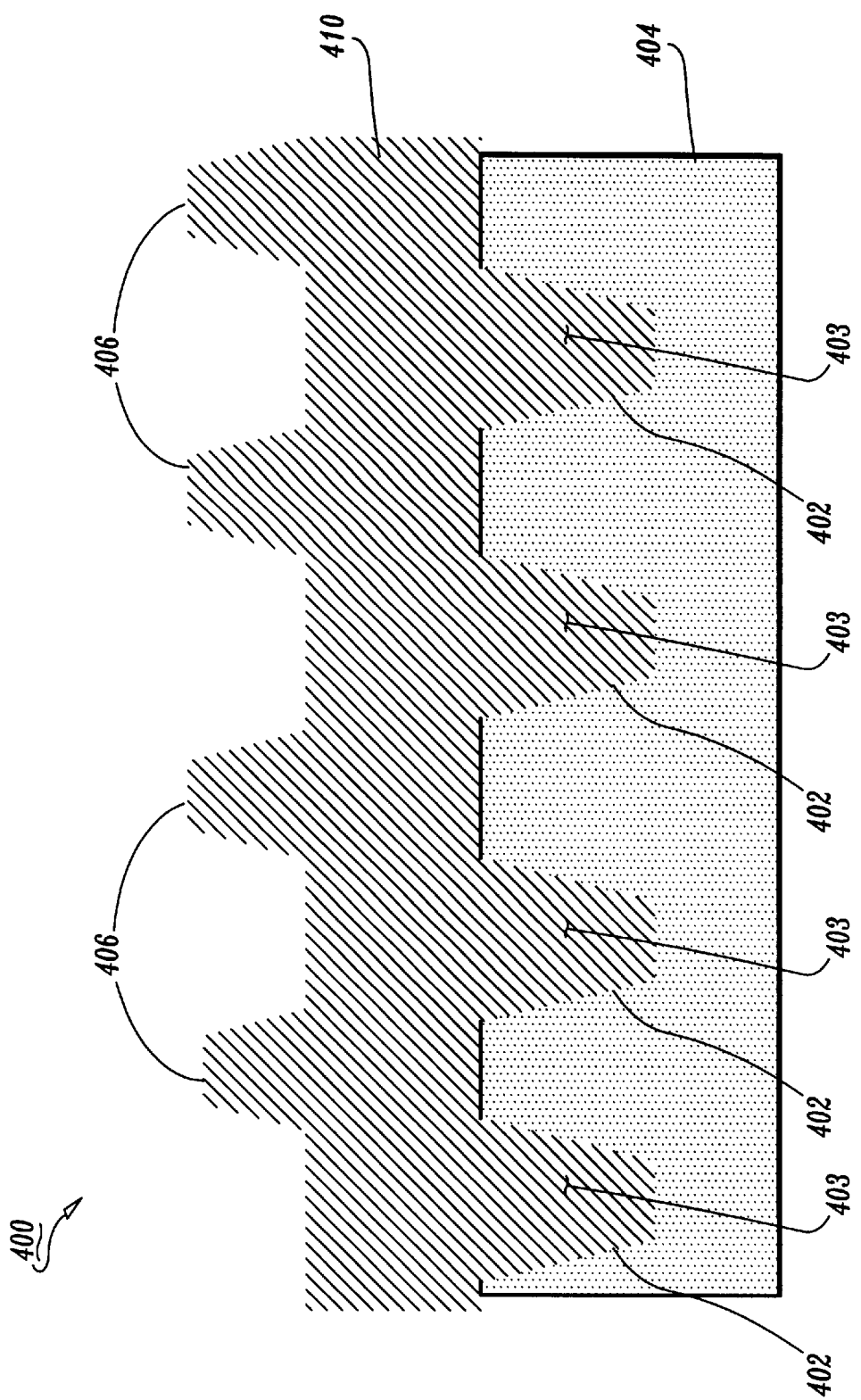
FIG. 8 is a cross-sectional view of a semiconductor wafer showing a dielectric material to be planarized in accordance with the present invention.

In block 302, wafer 108 is processed to form surface features. FIG. 8 shows a cross-sectional view of a semiconductor device 400 having features, such as, trenches 402 formed in a substrate 404 by employing conventional etching techniques. Trenches 402 may be formed by employing a hard mask (not shown) and anisotropic dry etching, e.g., reactive ion etching, of substrate 404 in accordance with the hard mask. Other conventional etching processes may also be employed. Trenches 402 may include isolation regions 403, such as shallow trench isolation regions employed for isolating devices formed in or on substrate 404. Trenches 402 may be formed for other purposes and structures as well. Up features 406 are formed during deposition of dielectric material 410 as a result of the topographical features of substrate 404.

In block 304, as shown in FIG. 8, isolation regions 408 (e.g., STI) or other structures may be formed by depositing/sputtering a dielectric material 410. Dielectric material 410 preferably includes an oxide and more preferably a silicon oxide. In one embodiment, shallow trench isolation regions are formed by filling trenches 402 with dielectric material 108. It should be noted that upper surfaces of substrate 404 may be covered by other layers (not shown), such as a pad oxide layer or pad nitride layer or other dielectric layers for patterning or processing the devices.

Figure 9:
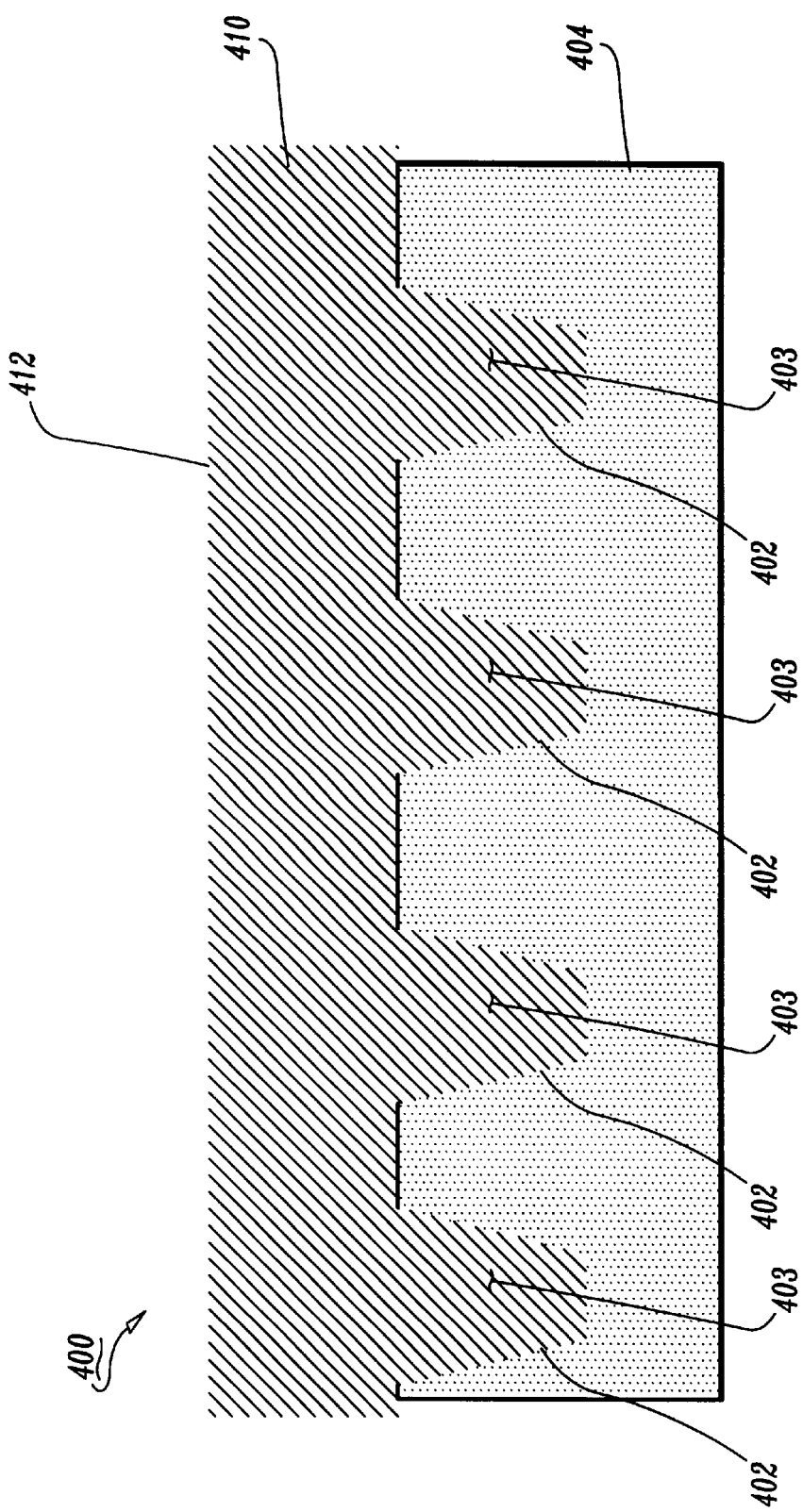
FIG. 9 is a cross-sectional view of the semiconductor wafer of FIG. 8 after the dielectric material is planarized in accordance with the present invention.
Figure 10:
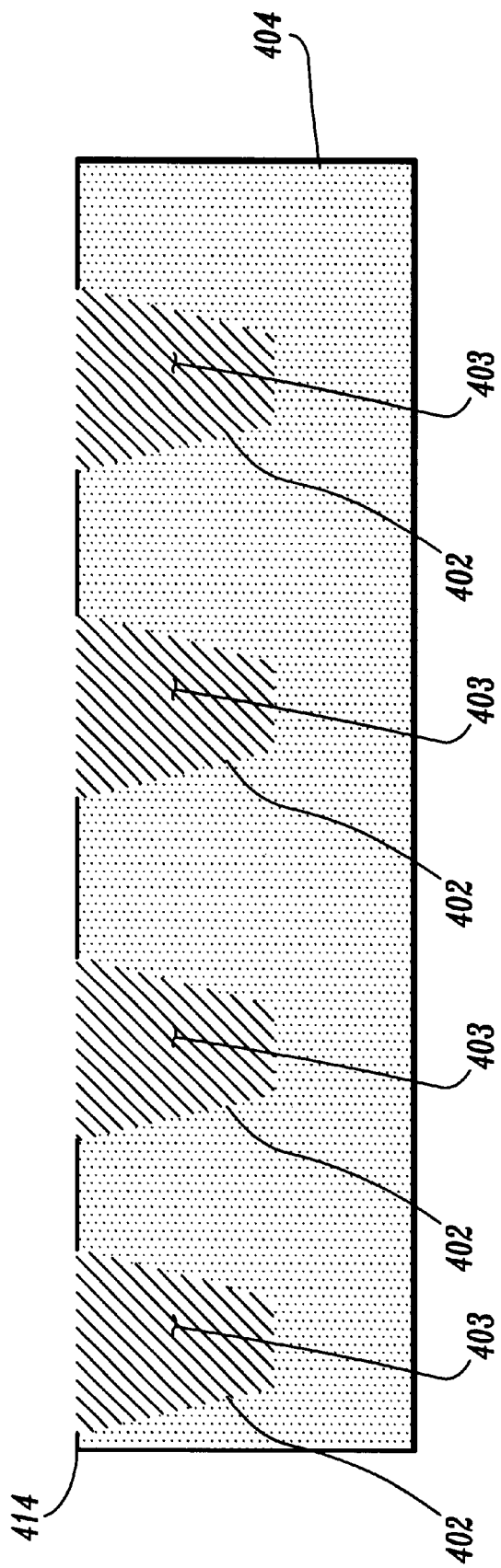
FIG. 10 is a cross-sectional view of the semiconductor wafer of FIG. 9 after the dielectric material is polished for bulk removal in accordance with the present invention.

In block 306, a planarizing polishing step is performed as described above with reference to FIG. 3. This results in a planarized top surface 412 for dielectric material 410, as shown in FIG. 9. In block 308, a bulk removal polishing step is performed to optimize uniformity across the wafer as described above with reference to FIG. 5. This results in bulk removal of dielectric material 410 down to a target thickness or height 414, as shown in FIG. 10, which includes significantly greater uniformity across the wafer. By separating the CMP process (used in the fabrication of isolation regions) into two distinct steps or processes (blocks 306 and 308), planarization can be improved to the point where the costly mask and etch pre-planarization step can be eliminated.

Figure 11:
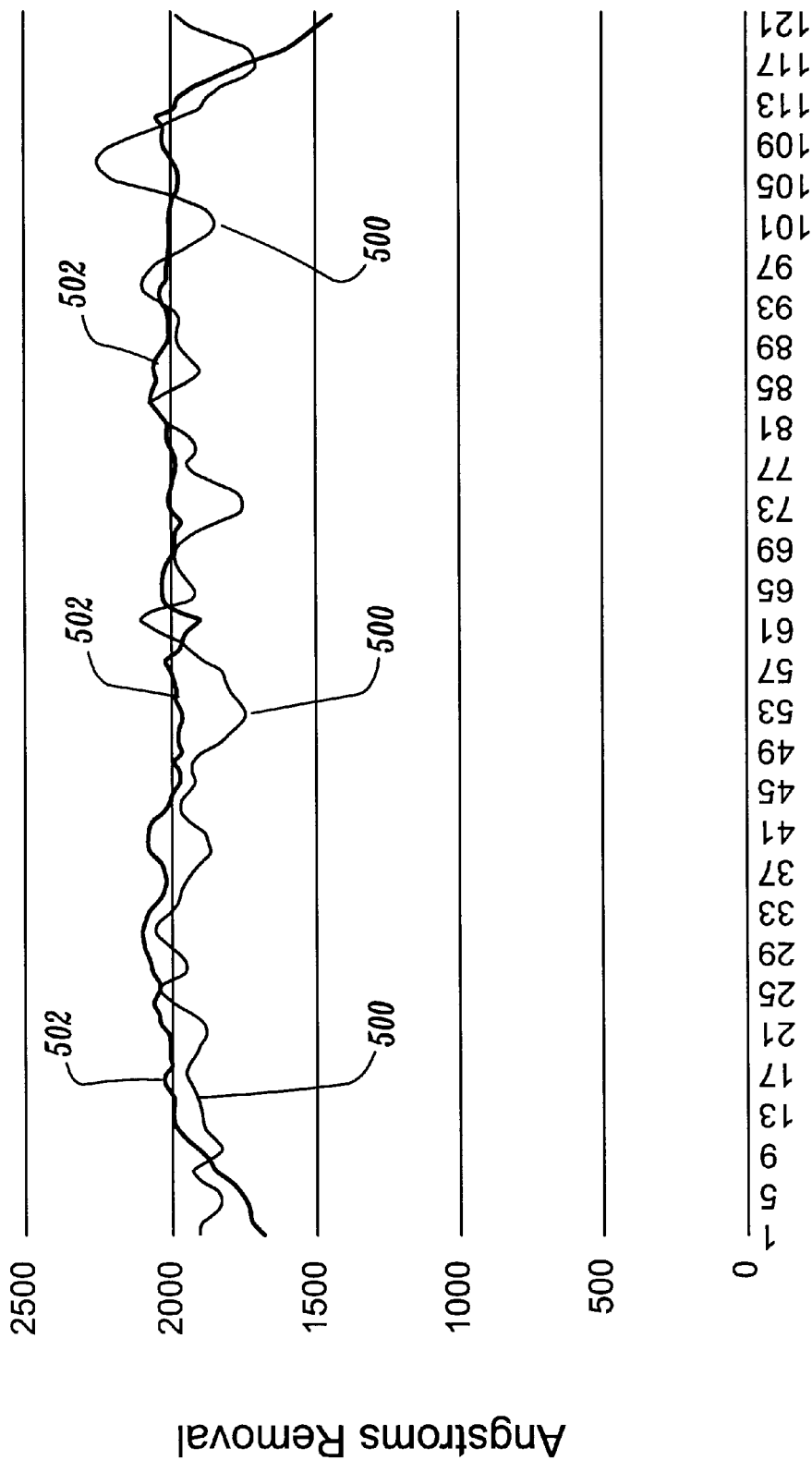
FIG. 11 are plots showing amounts of material removed across a wafer after planarizing a wafer with a single pad and after the two step process in accordance with the present invention.

Referring to FIG. 11, an illustrative plot is shown which compares a wafer polished in accordance with the planarization step of block 306 for a predetermined polish time versus a wafer polished in accordance with the two step process (blocks 306 and 308) of the present invention for the same predetermined polish time. Angstroms of oxide removed (y-axis) are plotted versus measurements made at a plurality of different sites (sits) on the wafers. Removal of 2000 angstroms was the target. Curve 500 shows wafers polished in accordance with the one step planarization due to the nature of hard pad polishing. Curve 500 is subject to large variations in measured oxide removal thickness. Curve 502 shows wafers polished in accordance with the two step process of the present invention. The removal thickness provided by the two step process (curve 502) present invention is significantly more uniform than curve 500.

Figure 12:
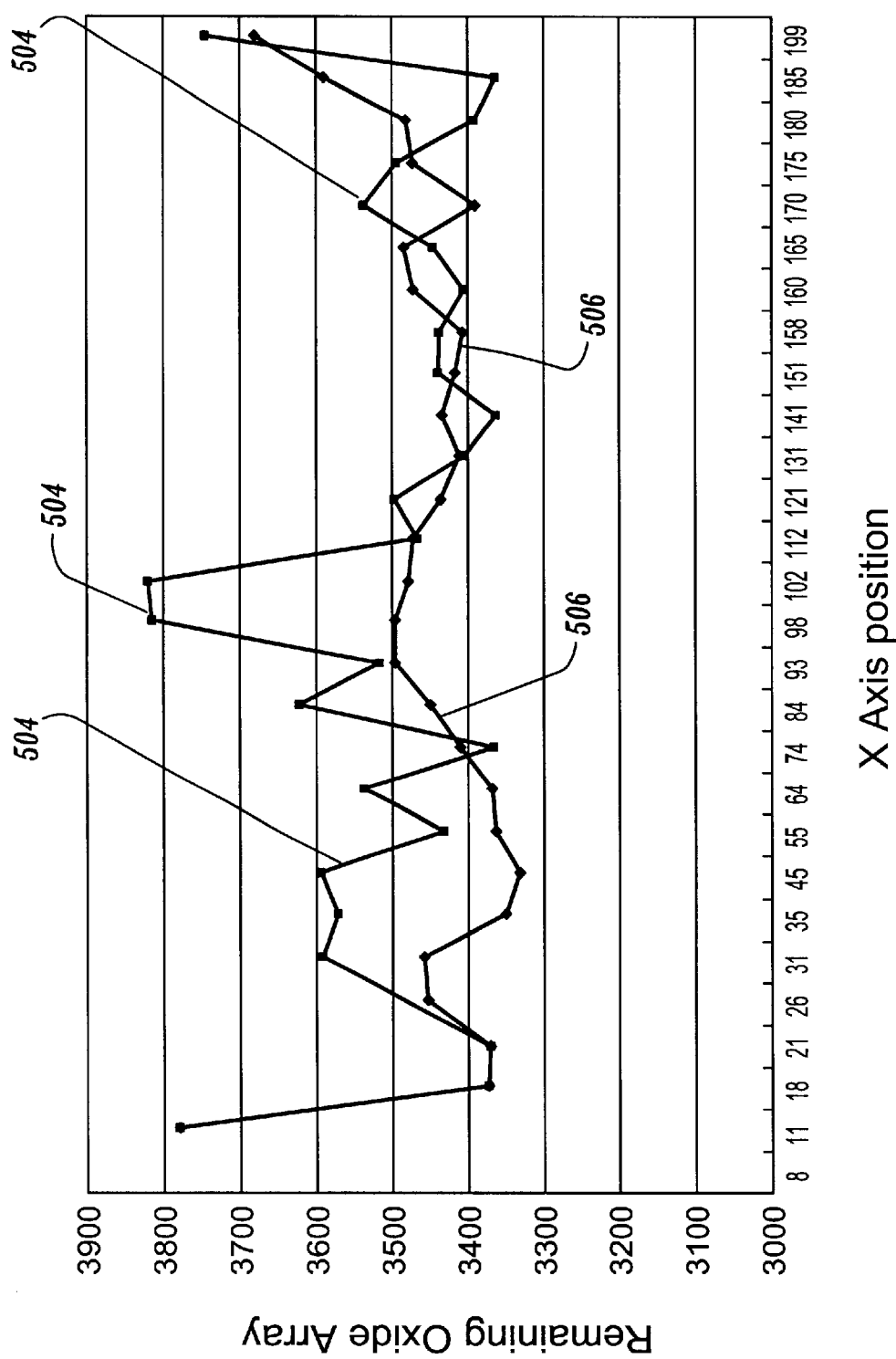
FIG. 12 are plots showing amounts of oxide remaining across a wafer after planarizing a wafer with a single pad and after the two step process in accordance with the present invention.

Referring to FIG. 12, a comparison of remaining oxide thickness (in angstroms) over a memory array is plotted versus wafer position across a wafer. Curve 504 shows wafers polished in accordance with the planarization step (306) for a predetermined polish time. Curve 504 is subject to large variations in measured oxide thickness. Curve 506 shows wafers polished in accordance with the two step process of the present invention for the same predetermined amount of polish time. The remaining thickness is significantly more uniform across the wafer when polishing is provided by the two step process of the present invention.

In accordance with the present invention, planarization curves measured by the inventor verify that most planarization occurs in first 50% of polish and wafer non-uniformity is significantly reduced with a stacked pad in a second polishing step. By employing the two step polish process, array step height compares favorably over prior art techniques. In addition, in one illustrative measurement remaining oxide range was reduced from an average of 363 angstroms to 237 angstroms which provides oxide removal significantly closer to target values. While defectivity results and selectivity of oxide to nitride are comparable, the wafer's visual appearance is improved since planarity is significantly improved by the methods of the present invention.

Having described preferred embodiments for two step chemical mechanical polishing process (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for planarizing a semiconductor wafer, comprising the steps of:
   providing a semiconductor wafer having topographical features;
   forming a dielectric layer on the semiconductor wafer to fill portions between the features;
   planarizing the dielectric layer across the entire semiconductor wafer for a first portion of a planarizing process; and
   subsequently polishing the dielectric layer for bulk removal of the dielectric layer using a stacked pad for a remaining portion of the planarizing process.

2. The method as recited in claim 1, wherein the step of planarizing includes employing a single non-stacked polishing pad.

3. The method as recited in claim 2, wherein the polishing pad includes urethane.

4. The method as recited in claim 1, wherein the step of planarizing includes employing a fixed abrasive pad.

5. The method as recited in claim 1, wherein the stacked polishing pad includes a first pad for contacting the wafer and a second pad for supporting the first pad, the second pad being softer than the first pad to improve planarity.

6. The method as recited in claim 1, wherein the subsequent step of the planarizing process further comprises polishing the dielectric layer with a precipitated silica particle slurry.

7. The method as recited in claim 1, wherein the first portion of the planarizing process includes polishing with a fumed silica slurry.

8. The method as recited in claim 1, wherein the first portion of the planarizing process includes the step of polishing with a fixed abrasive pad and a chemical for activating the polishing of the fixed abrasive pad.

9. The method as recited in claim 1, wherein the steps of planarizing and polishing are performed on different platens of a same tool.

10. The method as recited in claim 1, wherein first portion is about 50% of a total time for the planarizing process.

11. A method for planarizing a dielectric layer of a semiconductor wafer, comprising the steps of:
    providing a semiconductor wafer having topographical features;
    forming a dielectric layer on the semiconductor wafer to fill portions between the features;
    providing a first polishing substance on a planarization polishing pad;
    planarizing the dielectric layer with the first polishing substance and the planarization polishing pad for a first portion of a planarizing process;
    providing a second polishing substance on a bulk removal polishing pad, wherein the bulk removal pad includes a first pad for contacting the wafer and a second pad for supporting the first pad, the second pad being softer than the first pad to improve planarity; and
    subsequently polishing the dielectric layer with the second polishing substance and the bulk removal polishing pad for bulk removal of the dielectric layer for a remaining portion of the planarizing process.

12. The method as recited in claim 11, wherein the planarization polishing pad includes a single non-stacked pad.

13. The method as recited in claim 12, wherein the single non-stacked pad includes urethane.

14. The method as recited in claim 11, wherein the planarization polishing pad includes a fixed abrasive pad and the first polishing substance includes a chemical solution.

15. The method as recited in claim 11, wherein the first polishing substance includes a fumed silica slurry.

16. The method as recited in claim 11, wherein the second polishing substance includes a precipitated silica slurry.

17. The method as recited in claim 11, wherein the first and remaining portion steps of planarizing and polishing are performed on different platens of a same tool.

18. The method as recited in claim 11, wherein the first portion of the planarizing process is about 50% of a total time for the planarizing process.

19. A method for planarizing a semiconductor wafer, comprising the steps of:
    providing a semiconductor wafer having topographical features; forming a dielectric layer on the semiconductor wafer to fill portions between the features;
    providing a first platen of a polishing tool with a first slurry on a single non-stacked polishing pad;
    planarizing the dielectric layer with the first slurry and the single non-stacked polishing pad for a first portion of a planarizing process;

providing a second platen on the polishing tool with a second slurry on a stacked polishing pad;

transferring the wafer to the second platen; and subsequently polishing the dielectric layer with the second slurry and the stacked polishing pad for bulk removal of the dielectric layer for a remaining portion of the planarizing process.

20. The method as recited in claim 19, wherein the single non-stacked pad includes a urethane polishing pad.

21. The method as recited in claim 19, wherein the stacked polishing pad includes a first pad for contacting the wafer and a second pad for supporting the first pad, the second pad being softer than the first pad to improve planarity.

22. The method as recited in claim 19, wherein the first slurry includes a fumed silica particle slurry.

23. The method as recited in claim 19, wherein the second slurry includes a precipitated silica slurry.

24. The method as recited in claim 19, wherein the first portion of the planarizing process is about 50% of a total time for the planarizing process.

* * * * *